(12) United States Patent
Yang et al.

(10) Patent No.: US 7,176,567 B2
(45) Date of Patent: Feb. 13, 2007

(54) SEMICONDUCTOR DEVICE PROTECTIVE STRUCTURE AND METHOD FOR FABRICATING THE SAME

(75) Inventors: Wen-Kun Yang, Hsin-Chu (TW); Kuang-Chi Chao, Kaohsiung (TW); Cheng-hsien Chiu, Kaohsing (TW); Chihwei Lin, Gueiren Township, Tainan County (TW); Jui-Hsien Chang, Jhudong Township, Hsinchu County (TW)

(73) Assignee: Advanced Chip Engineering Technology Inc., Hsinchu County (TW)

( * ) Notice: Subject to any disclaimer, the term of this patent is extended or adjusted under 35 U.S.C. 154(b) by 0 days.

(21) Appl. No.: 11/175,420

(22) Filed: Jul. 6, 2005

(65) Prior Publication Data
US 2007/0007648 A1  Jan. 11, 2007

(51) Int. Cl.
*H01L 23/04* (2006.01)
*H01L 23/24* (2006.01)
*H01L 23/06* (2006.01)

(52) U.S. Cl. .................. 257/730; 257/687; 257/729

(58) Field of Classification Search ............... 257/687, 257/704, 729, 730
See application file for complete search history.

(56) References Cited

U.S. PATENT DOCUMENTS

| | | | |
|---|---|---|---|
| 6,531,770 B2* | 3/2003 | Nakashima | 257/704 |
| 6,759,745 B2* | 7/2004 | Masumoto et al. | 257/730 |
| 6,849,940 B1* | 2/2005 | Chan et al. | 257/706 |
| 2002/0063326 A1* | 5/2002 | Nakashima | 257/704 |
| 2003/0141563 A1* | 7/2003 | Wang | 257/432 |
| 2004/0155331 A1* | 8/2004 | Thurgood et al. | 257/729 |

* cited by examiner

*Primary Examiner*—Ngân V. Ngô
(74) *Attorney, Agent, or Firm*—Kusner & Jaffe

(57) ABSTRACT

The present invention provides a semiconductor device protective structure. The structure comprises a die with contact metal balls formed thereon electrically coupling with a print circuit board. A back surface of the die is directly adhered on a substrate and a first buffer layer is formed on the substrate. The substrate is configured over a second buffer layer such that the second buffer layer substantially encompasses the whole substrate to decrease damage to the substrate when the side of the substrate is collided with an external object.

8 Claims, 4 Drawing Sheets

SEMICONDUCTOR DEVICE PROTECTIVE STRUCTURE AND METHOD FOR FABRICATING THE SAME

FIELD OF THE INVENTION

This invention relates to a semiconductor device structure, and more particularly to a semiconductor device protective structure and method for fabricating the same, the semiconductor device structure can avoid the die or substrate from cracking due to the side of the die or substrate collided with an external object.

BACKGROUND OF THE INVENTION

Description of the Prior Art

Typically in the electronic component world, integrated circuits (IC's) are fabricated on a semiconductor substrate, known as a chip, and most commonly are made of silicon. The silicon chip is typically assembled into a larger package which serves to provide effective enlargement of the distance or pitch between input/output contacts of the silicon making it suitable for attachment to a printed circuit board, and to protect the IC from mechanical and environmental damage. With the trend moving to more and more features packed into decreasing product envelopes, utilizing ever smaller electronic components to improve upon size and feature densification a constant and formidable challenge is presented to manufacturers of consumer and related articles.

Chip scale packages (CSP) were developed to provide an alternative solution to directly attached flip chips devices. These packages (CSP) represent a new miniature type of semiconductor packaging used to address the issues of size, weight, and performance in electronic products, especially those for consumer products such as telephones, pagers, portable computers, video cameras, etc. Standards have not yet been formalized for CSP, and as a result, many variations exist, and several of which are described in "Chip Scale Package", cited above. In general, the chip is the dominant constituent of a CSP with the area of the package, being no more than 20% greater than the area of the chip itself, but the package has supporting features which make it more robust than direct attachment of a flip chip.

As shown in FIG. 1, it is a side view of a flip chip device 100 according to prior art. The flip chip 100 includes a die 102 with metal pads 105 that typically has a conventionally fabricated IC device structure. The die 102 has a plurality of electrical contacts 104, such as redistribution layer (RDL) trace. Bumps 103, such as solder balls, are formed on the electrical contacts 104. A protection layer 106 covers the electrical contacts 104 to expose the electrical contacts 104 for allowing the solder balls 103. Moreover, a protective film 101 is applied to the bottom surface of the die 102.

The protective film 101 may be formed from any suitable material. For example, the protective film 101 may be formed from a plastic material or epoxy. This epoxy is commonly also used as a glob top material for chip-on-board applications that protects the die 102 and wire bonds. The protective film 101 may have any thickness that substantially prevents chipping during the dicing operation and is suitable for the particular application. For example, the protective film 101 may have a thickness that allows laser marking of the thick film without the laser penetrating the thick film. Preferably, the protective film 101 is between about 1.5 and 5 mils. Most preferably, the protective film is between about 2 and 3 mils.

Furthermore, the substrate of the flip chip or semiconductor device (such as integrated circuit's) has a friability property such that these devices are easily result in cells edge of the wafer fail due to the substrate being lateral damage or cracking owing to the side of the die or the substrate colliding with an external object or applied by an lateral external force. Therefore, the reliability or the life time of the flip chip or semiconductor device will be decrease.

In view of the aforementioned, the present invention provides an improved semiconductor device structure to overcome the above drawback.

SUMMARY OF THE INVENTION

To achieve the foregoing and other objects and according to the purpose of the present invention, a semiconductor device protective structure and method for fabricating the same are disclosed.

The semiconductor device protective structure of the present invention can avoid the die or substrate from cracking due to the side of the die or substrate collided with an external object.

The semiconductor device protective structure of the present invention may avoid the die or substrate from cracking by a buffer layer substantially encompassing the die or substrate to decrease damage to the die or substrate when the side of the die or substrate is collided with an external object.

The present invention provides a semiconductor device protective structure. The structure comprises a die having a plurality of electrical contacts on a first surface of the die. A plurality of conductive balls coupled to the contacts. A protective layer is covered the plurality of electrical contacts and the dielectric layer to expose the electrical contacts for allowing the conductive balls electrically coupling with an external part. A second surface of the die is directly adhered on a substrate. A first buffer layer is formed on the substrate and adjacent to the die. The substrate is configured over a second buffer layer such that the second buffer layer substantially encompasses the whole substrate, whereby to decrease damage to the substrate when the side of the substrate is collided with an external object.

Wherein the substrate includes slope sidewall slots formed therein. Wherein the second buffer layer is refilled into the slope sidewall slots. Wherein a depth of the slope sidewall slot is substantially the same with a thickness of the substrate.

In another aspect, the present invention discloses a method for manufacturing a semiconductor device protective structure. The method comprises providing a plurality of dice with a plurality of conductive balls formed thereon electrically coupling with an external part. Next, the plurality of dice are adhered over a substrate. A first buffer layer is formed over the substrate and adjacent to the dice to expose the plurality of conductive balls. A partial of the substrate is removed to form a plurality of slots and substantially aligned to the first buffer layer. Finally, a second buffer layer is formed over the substrate and filled with the plurality of slots.

The above-mentioned method further comprises a step of sawing and/or etching the substrate along about the substantially center of the slots into a plurality of individual semiconductor devices protective structure.

Wherein the slots includes slope sidewall slots. Wherein a depth of the slope sidewall slot is substantially the same with a thickness of the substrate.

In yet another aspect, the present invention discloses a method for manufacturing a semiconductor device protective structure. The method comprises providing a substrate having a plurality of dice with a plurality of conductive balls formed thereon. Next, a backside surface of partial substrate is removed to form a plurality of slots. A buffer layer is formed over the substrate and filled with the plurality of slots.

The above-mentioned method further comprises a step of sawing and/or etching the substrate along about the substantially center of the slots into a plurality of individual semiconductor devices protective structure.

The buffer layer may reach the function to avoid the dice or substrate from damaging when the side part of the dice or substrate collides with an external object.

BRIEF DESCRIPTION OF THE DRAWINGS

The above objects, and other features and advantages of the present invention will become more apparent after reading the following detailed description when taken in conjunction with the drawings, in which.

DESCRIPTION OF THE PREFERRED EMBODIMENT

Method and structure for protecting a semiconductor device (such as integrated circuit) or a substrate during and after a dicing operation are described below. In the following description, numerous specific details are set forth in order to provide a thorough understanding of the present invention, and the scope of the present invention is expressly not limited expect as specified in the accompanying claims.

In one embodiment, the present invention discloses a method for manufacturing a semiconductor device protective structure. The method comprises providing a substrate, such as a silicon wafer, having a plurality of dice with a plurality of conductive balls formed thereon. Next, portions of the backside surface of the substrate are removed to form a plurality of slots 206. A buffer layer is formed over the substrate and filled within the plurality of slots 206. The buffer layer comprises BCB, SINR (Siloxane polymer), epoxy, polyimides or resin. Moreover, a step of removing the partial substrate is performed by sawing or etching.

Figure 1:
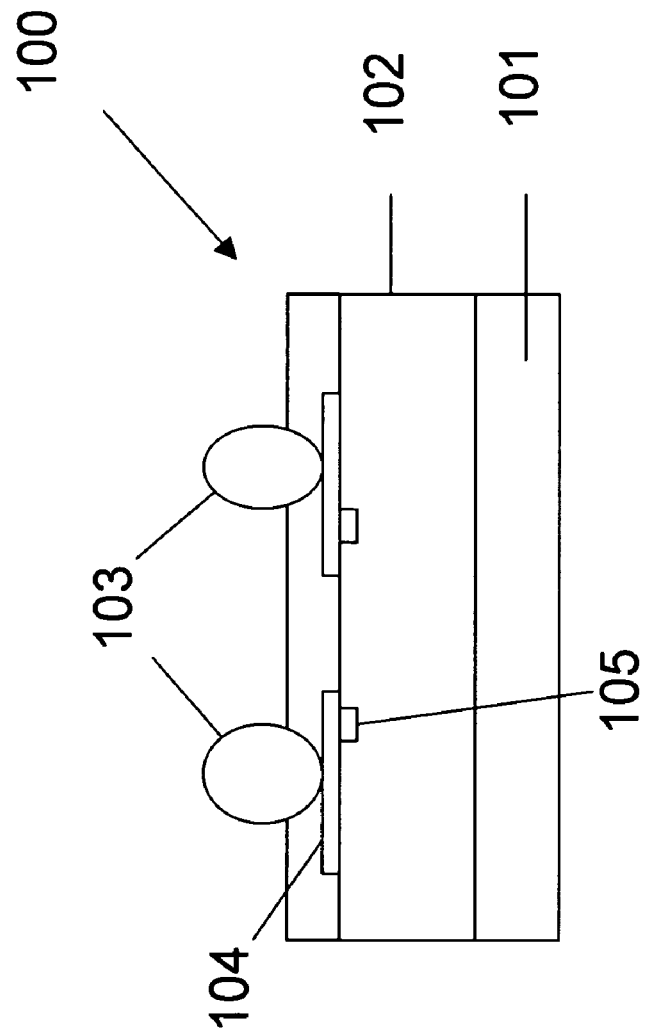
FIG. 1 is a diagrammatic side view of a flip chip device according to the prior art.
Figure 2:
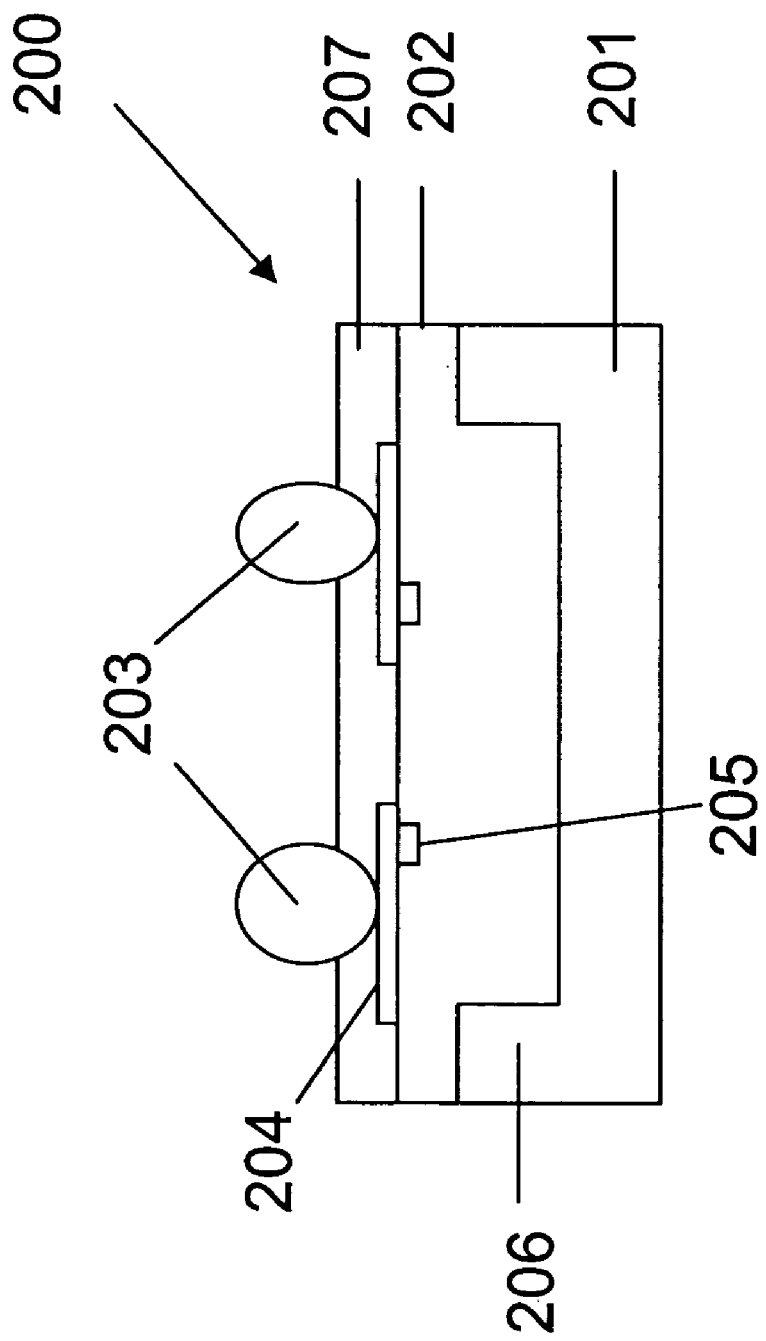
FIG. 2 is a schematic diagram of a semiconductor device protective structure according to the present invention.

The above-mentioned method further comprises a step of sawing and/or etching the substrate along about the substantially center of the slots, thereby separating the substrate into a plurality of individual semiconductor devices with protective structure 200, shown as FIG. 2. The buffer layer may reach the function to reduce the die from being lateral damage due to less contact area of the die when the side part of the dice collides with a lateral external object.

As shown in FIG. 2, it is a side view of a semiconductor device protective structure 200 according to the present invention. The semiconductor device protective structure 200 includes a die 202 with metal pads 205. The die 202 has a plurality of electrical contacts 204, such as RDL trace. Bumps 203, such as solder balls, are formed on the electrical contacts 204. A protection layer 207 covers the electrical contacts 204 to expose the electrical contacts 204 for allowing the solder balls 203.

The die 202 includes a plurality of slots formed inwardly from the backside surface of the die 202 into partial of the die 202. Moreover, a buffer layer 201 is applied to the bottom surface of the die 202 and refilled into the slots for protection. Because the slots 206 performed by sawing or etching method is filled with BCB, SINR (Siloxane polymer), epoxy, polyimides or resin, the less contact area of the die 202 is arrived. Therefore, the buffer layer 201 may reach the function to reduce the die 202 from being lateral damage due to less contact area of the die 202 when the lateral part of the dice 202 collides with an external object or applied by an lateral external force.

Figure 3:
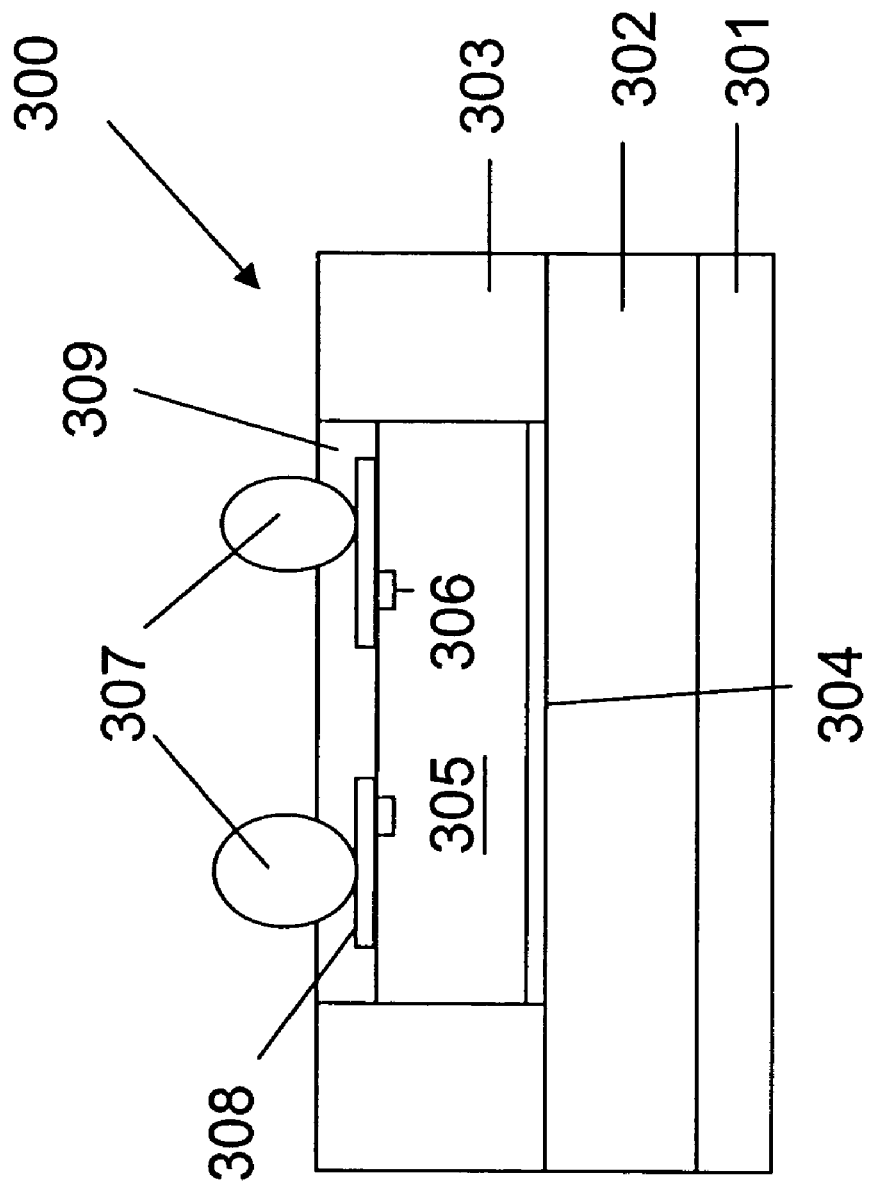
FIG. 3 is a schematic diagram of a semiconductor device structure.

As shown in FIG. 3, it is a side view of a semiconductor device structure 300. The semiconductor device structure 300 comprises a die 305 with metal pads 306 and contact metal balls 307 formed thereon electrically coupling with a print circuit board (not shown). A protection layer 309 covers the electrical contacts 308 to expose the electrical contacts 308 for allowing the contact metal balls 307.

A backside surface of the die 305 is directly adhered on a substrate 302 through an adhesive layer 304 and a first buffer layer 303 is formed on the substrate 302. The first buffer layer 303 is formed adjacent to the die 305. It should be note that the dimension of the substrate 302 is larger than the one of the die 305. The substrate 302 is configured over a second buffer layer 301. The substrate 302 may be damaged or cracked when the side of the substrate 302 is collided with an external object or applied by an external force due to lack of protection of the second buffer layer 301. Therefore, the die 305 may be peeled from the substrate 302, the reliability and the life time of the semiconductor device structure 300 will be decreased.

In another aspect, the present invention discloses a method for manufacturing a semiconductor device protective structure. The method comprises providing a plurality of dice with a plurality of conductive balls formed thereon electrically coupling with an external part. Next, the plurality of dice are adhered over a substrate. A first buffer layer is formed over the substrate to expose the plurality of conductive balls. A partial substrate is removed to form a plurality of slots substantially aligned to the first buffer layer. Finally, a second buffer layer is formed over the substrate and filled with the plurality of slots.

Figure 4:
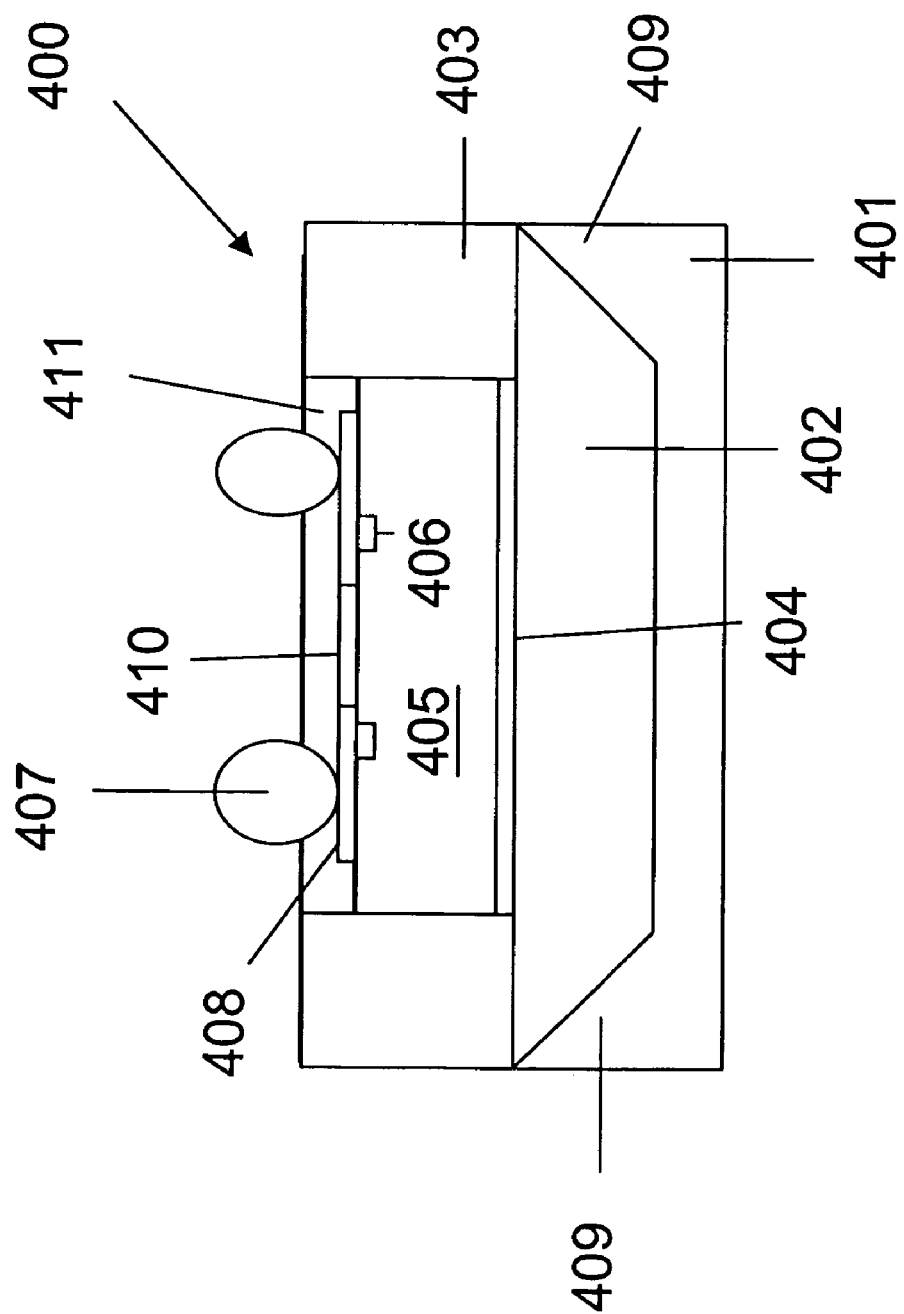
FIG. 4 is a schematic diagram of a semiconductor device protective structure according to the present invention.

The above-mentioned method further comprises a step of sawing and/or etching the substrate along about the substantially center of the slots, thereby separating the dice into a plurality of individual semiconductor devices with protective structure 400, shown as FIG. 4.

In the embodiment, the semiconductor device protective structure 400 according to the present invention comprises a die 405 with contact metal balls 407 formed thereon electrically coupling with a print circuit board (PCB) or external parts (not shown). A dielectric layer 410 is covered a partial region of the die to 405 expose the plurality of electrical contacts 408. In one embodiment, the electrical contacts 408 are metal alloy, for example Ti/Cu alloy formed by sputtering and/or Cu/Ni/Au alloy formed by electroplating. A protective layer 411 is covered the plurality of electrical contacts 408 and the dielectric layer 410 to expose the electrical contacts 408 for allowing conductive balls 407 electrically coupling with the print circuit board (PCB) or external parts (not shown). In one preferred embodiment, the material of the protective layer 411 comprises BCB, SINR (Siloxane polymer), epoxy, polyimides or resin. A backside surface of the die 405 is directly adhered on a substrate 402 through an adhesive layer 404 and a first buffer layer 403 is formed on the substrate 402 and adjacent to the die 405. For example, the substrate 402 comprises silicon, glass, alloy 42, quartz or ceramic.

Moreover, the first buffer layer 403 comprises silicone rubber BCB, SINR (Siloxane polymer), epoxy, polyimides or resin.

The substrate 402 is configured over a second buffer layer 401 such that the second buffer layer 401 substantially encompasses the whole substrate 402 due to the slope sidewall slots 409 to decrease damage to the substrate 402 when the side of the substrate 402 is collided with an external object or applied by an external force, shown as FIG. 4. Therefore, the reliability and the life time of the semiconductor device protective structure 400 of the present invention will be increased. Especially, when the second buffer layer 401 encompasses the whole substrate 402. In one case, the slope sidewall slots 409 can be etched by wet etching or other controllable dry etching and chemical erosion. The depth of the slope sidewall slot 409 is substantially the same with the thickness of the substrate 402.

In one preferred embodiment, the material of the second buffer layer 401 comprises silicone rubber BCB, SINR (Siloxane polymer), epoxy, polyimides or resin.

Hence, according to the present invention, the aforementioned semiconductor device protective structure has the advantages that the protective structure of the present invention may avoid the die or substrate from cracking by the buffer layer substantially encompassing the die or substrate to decrease damage to the die or substrate when the side of the die or substrate is applied by an external force.

Although specific embodiments have been illustrated and described, it will be obvious to those skilled in the art that various modifications may be made without departing from what is intended to be limited solely by the appended claims.

What is claimed is:

1. A semiconductor device protective structure, comprising:
    a die having a plurality of electrical contacts on a first surface of said die;
    a plurality of conductive balls coupled to said contacts;
    a substrate adhered on a second surface of said die;
    a first buffer layer formed on said substrate and adjacent to said die; and
    a second buffer layer, wherein said substrate is configured over said second buffer layer such that said second buffer layer substantially encompasses the whole said substrate, whereby to decrease damage to said substrate when the side of said substrate is applied by an external force.

2. The structure in claim 1, wherein said substrate includes slope sidewall slots formed therein.

3. The structure in claim 2, wherein said second buffer layer is refilled into said slope sidewall slots.

4. The structure in claim 2, wherein a depth of said slope sidewall slot is substantially the same with a thickness of said substrate.

5. The structure in claim 1, furthering comprising a protective layer covering said electrical contacts to expose said electrical contacts for allowing said plurality of conductive balls electrically coupling with an external part.

6. The structure in claim 5, wherein the material of said protective layer comprises silicone rubber BCB, SINR (Siloxane polymer), epoxy, polyimides or resin.

7. The structure in claim 1, wherein said substrate comprises silicon, glass, alloy 42, quartz or ceramic.

8. The structure in claim 1, wherein the material of said first buffer layer and said second buffer layer comprise silicone rubber BCB, SINR (Siloxane polymer), epoxy, polyimides or resin.

* * * * *